July 7, 1953 L. L. KOROS 2,644,925

SEMICONDUCTOR AMPLITUDE MODULATION SYSTEM

Filed Dec. 29, 1950

INVENTOR
Leslie L. Koros
BY H. L. Newton
ATTORNEY

Patented July 7, 1953 2,644,925

UNITED STATES PATENT OFFICE 2,644,925

SEMICONDUCTOR AMPLITUDE MODULATION SYSTEM

Leslie L. Koros, Camden, N. J., assignor to Radio Corporation of America, a corporation of Delaware Application December 29, 1950, Serial No. 203,398

4 Claims. (Cl. 332—31)

This invention relates generally to amplitude modulation systems, and particularly relates to a semi-conductor amplifier circuit arranged to modulate the amplitude of a carrier wave.

A semi-conductor amplifier circuit may be utilized for modulating the amplitude of a carrier wave. To this end, the carrier wave may be impressed between the emitter and base electrodes of a semi-conductor amplifier or transistor. The modulation signal may be impressed between the collector and base electrodes of the amplifier circuit. Accordingly, the amplitude of the carrier wave derived between the collector and base electrodes will be modulated in accordance with the modulation signal.

However, it has been found that in such an amplitude modulation system utilizing a transistor the amplitude modulated carrier wave derived from the output circuit is also phase modulated. This phase modulation represents distortion which is undesired. This phase distortion of the output wave is caused by a leakage current between the input and output electrodes of the transistor, that is, essentially between the emitter and collector electrodes. Accordingly, a portion of the carrier wave which is the exciting energy leaks over into the output circuit and the phase of this leakage current may be different from the phase of the amplified output wave. The result is that the amplified and amplitude modulated output wave has a certain amount of phase distortion.

It is believed that this phase distortion is caused by the internal impedance of the transistor. This internal impedance, which appears between the electrodes of the transistor, produces a leakage current in the collector circuit which may have any phase relationship with the amplified output wave.

It is accordingly the principal object of the present invention to provide an improved amplitude modulation system including a semi-conductor amplifier which will substantially eliminate undesired phase modulation of the output wave.

A further object of the invention is to provide a transistor amplifier circuit arranged to modulate the amplitude of carrier wave wherein means are provided to compensate for transistor leakage current which may cause undesired phase modulation of the amplitude-modulated output wave.

An amplitude modulation system in accordance with the present invention comprises a semi-conductor device such as a transistor. The device includes a semi-conducting body. A base electrode, an emitter electrode and a collector electrode are provided in contact with the body. The carrier wave to be modulated is impressed between the emitter and base electrodes. The modulation signal is applied between the collector and base electrodes. A load impedance element such as a utilization circuit is coupled effectively between the collector and the base, and an amplified carrier wave, which is amplitude modulated in accordance with the modulation signal, is derived from the load impedance element as pointed out hereinabove.

The semi-conductor device inherently has leakage current between emitter and collector which will produce an undesired phase modulation of the amplified carrier wave. In accordance with the present invention circuit means are coupled to the collector electrode for substantially eliminating the undesired phase modulation of the amplified carrier wave.

This may be effected, for example, by providing a network coupled effectively between collector and base and designed to pass a predetermined harmonic of the carrier wave with the modulation side bands of the harmonic while rejecting the fundamental of the carrier wave with its modulation side bands if any. This network accordingly may be a high pass filter arranged to reject the fundamental of the carrier wave or it may be a band pass filter which will pass only a predetermined harmonic of the carrier wave with the modulation side bands of the harmonic.

Alternatively, a compensating network may be connected between the emitter electrode and a point on a resonant output circuit tuned to the carrier frequency, that is, to the frequency of the input wave. This compensating network is designed and arranged to cancel substantially the undesired leakage current.

Still another amplitude modulation system which will compensate for the undesired phase distortion inherent in a transistor has been disclosed and claimed in the copending application to L. L. Koros entitled "Transistor Amplitude Modulator," Serial No. 203,397, and filed concurrently herewith, now Patent No. 2,629,858, issued February 24, 1953.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
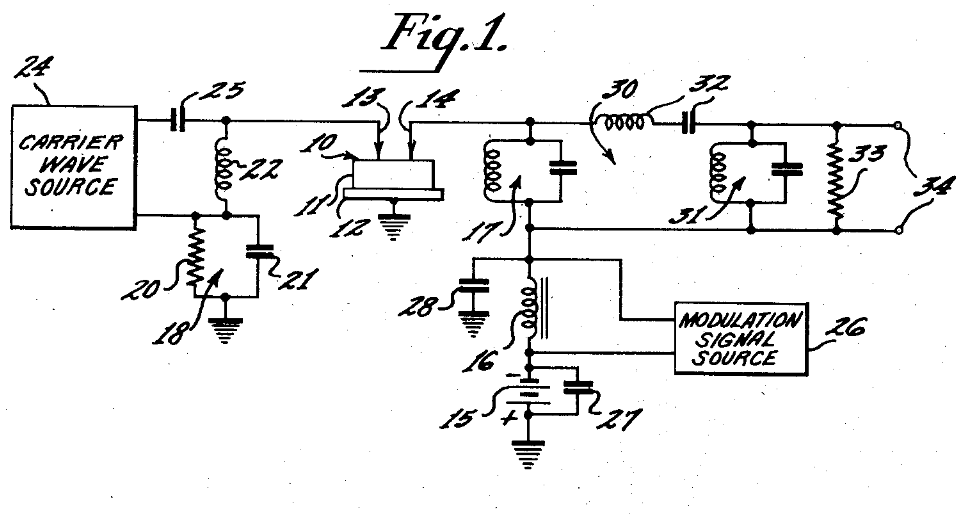
Figure 1 is a circuit diagram of an amplitude modulation system embodying the present invention and from which an amplitude modulated output wave is obtained at a harmonic of the carrier wave impressed thereon having substantially no undesired phase modulation.

Referring now to the drawing, in which like components have been designated by the same reference numerals throughout the figures, and particularly to Figure 1, there is illustrated an amplitude modulation system comprising a semi-conductor device 10. Semi-conductor device 10 includes a semi-conducting body 11 which may, for example, consist of silicon or preferably of germanium. The semi-conducting body 11 is prepared in a conventional manner well known in the art. A base electrode 12, an emitter electrode 13 and a collector electrode 14 are in contact with body 11. Base electrode 12 is in low-resistance contact with the body 11 and may be a large-area electrode as indicated. Emitter electrode 13 and collector electrode 14 are in rectifying contact with the body 11; they may be point electrodes as indicated or they may be in line contact with body 11 or even in large-area contact provided they form rectifying contacts with the body.

Operating potentials are applied to the electrodes 12 to 14. As is well known a potential in the reverse direction is applied between collector 14 and base 12. Furthermore, a potential in the forward direction is applied between emitter 13 and base 12. If semi-conducting body 11 is of the N type, the collector 14 should be negative and the emitter 13 positive with respect to the base 12. If body 11 should be of the P type the potentials must be reversed. It will be assumed for the following discussion that body 11 is of the N type.

Accordingly, base electrode 12 may be grounded as shown and a source of potential such as battery 15 may have its positive terminal grounded, while its negative terminal is connected through inductor 16 and a parallel resonant circuit 17 to collector 14. The emitter electrode may be biased by a suitable battery. However, it is also feasible as shown in Figure 1 to provide instead the bias network 18 including resistor 20 and capacitor 21 connected across the resistor. The capacitor 21, however, may be omitted in some cases. One terminal of bias network 18 is grounded while its other terminal is connected through choke coil 22 to emitter electrode 13.

A source of a carrier wave is indicated at 24. Source 24 excites the emitter 13. The carrier wave may have any frequency provided it is higher than the highest frequency of the modulation signal. Furthermore, the carrier wave developed by source 24 may be a sinusoidal wave or a wave of any other suitable shape. One terminal of carrier wave source 24 is coupled to emitter electrode 13 by a coupling capacitor 25. The other terminal of the carrier wave source 24 is connected to the junction point between choke coil 22 and bias network 18.

A source of a modulation signal is indicated at 26. The modulation signal may, for example, be an audio signal or a video signal or any other type of signal with which it is desired to modulate the carrier wave. Modulation signal source 26 is connected across inductor 16, which may be provided with a core as indicated, provided the modulation signal is an audio signal. Battery 15 may be bypassed by capacitor 27 to bypass the modulation signal currents. Capacitor 28 is connected between the junction point of inductor 16 and resonant circuit 17, on the one hand, and ground, on the other hand. Capacitor 28 functions as a carrier frequency bypass capacitor. Accordingly, the lower terminal of inductor 16 is bypassed to ground for modulation signal currents, while its upper terminal is bypassed to ground for carried frequency currents.

A network generally indicated at 30 is coupled between collector 14 and the upper terminal of inductor 16. Network 30 as illustrated is a triple tuned pi network including parallel resonant circuit 17, another parallel resonant circuit 31 and series resonant circuit 32. Series resonant circuit 32 is connected between the two parallel resonant circuits 17 and 31. The pi network 30 may be arranged as a band pass filter which will pass, for example, the second harmonic of the carrier wave with the side bands of the second harmonic and which will reject the fundamental of the carrier wave and its side bands. Actually all that is necessary is a high pass filter which will reject the fundamental of the carrier wave with its side bands. It is to be understood that network 30 may be replaced by any other suitable high pass or band pass filter network which will either reject the fundamental of the carrier wave with its side bands or which will pass only a predetermined harmonic of the carrier wave with the harmonic side bands.

A load impedance element such as a resistor 33 may be connected across the pi network 32. Accordingly, load resistor 33 is coupled effectively between collector 14 and base 12. The load resistor 33 represents a utilization network which may, for example, be the input circuit of the next amplifier stage. The output wave is derived from output terminals 34 connected across load resistor 33. If the modulation side bands of the selected harmonic have a small frequency range compared to the frequency of the harmonic, it is also feasible to replace the pi network 30 by a single tuned circuit having a high Q.

The operation of the amplitude modulation system of Figure 1 will now be explained. The carrier wave developed by source 24 is effectively impressed on the emitter electrode 13 since the base electrode 12 is grounded. Choke coil 22 prevents grounding of the impressed carrier wave. As is well known emitter 13 in combination with base 12 function as a peak rectifier for the impressed carrier wave. The thus rectified current flows through choke coil 22 and resistor 20 thereby to build up a charge across capacitor 21. The thus developed potential is the bias potential for the emitter electrode which will be positive with respect to ground or gas electrode 12. Preferably the bias potential developed by network 18 is of such a magnitude as to provide for class C operation of the device 10.

The circuit of Figure 1 functions as an amplifier circuit so that an amplified version of the impressed carrier wave appears at the load impedance element 33. The collector voltage developed by battery 15 is now modulated by the modulation signal developed by source 26. Accordingly, the amplitude of the output wave which appears across load resistor 33 is modulated in accordance with the modulation signal.

Figure 2:
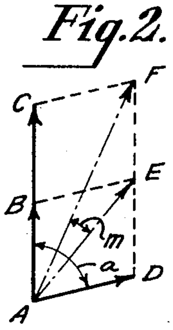
Figure 2 is a vector diagram which will be referred to in explaining the phase modulation of the carrier due to the leakage current.

As explained hereinbefore, a leakage current is inherently present in the device 10 which flows essentially between emitter 13 and collector 14. This leakage current may be out of phase with the amplified output wave thereby to produce phase modulation. The effect of this leakage current may be more readily understood by reference to the vector diagram of Figure 2. The voltage vector AB in Figure 2 represents the unmodulated output carrier wave which is developed at the load impedance element 33. The voltage vector BC is the vector sum of the two rotating side bands which are produced by the amplitude modulation during peak modulation of the carrier wave. Consequently, for 100 per cent modulation vector AB equals vector BC. The vector AD represents the leakage voltage which may form an angle $a$ with the output vector AC as explained previously. The vector sum AE represents the output carrier wave voltage if no modulation is present. If the leakage vector AD is added to the modulated carrier wave vector AC, the peak envelope voltage is shown by the vector AF. It will be seen that an angle $m$ is formed between the vectors AE and AF. This angle $m$ is a function of the modulation signal. Accordingly, the output carrier wave which is produced by a combination of the vector AC and AD has a phase modulation, the angle $m$ of which varies during the modulation cycle.

In accordance with the present invention, this undesired phase modulation is substantially eliminated by the provision of pi network 30 which will reject the carrier wave. The vector AD is of the same frequency as produced by source 24, therefore it is also rejected. Only the second harmonic of the carrier wave or another predetermined harmonic of the carrier wave with its modulation components is passed by the network 30 thereby the undesired phase modulation, due to the vector AD, is eliminated.

Figure 3:
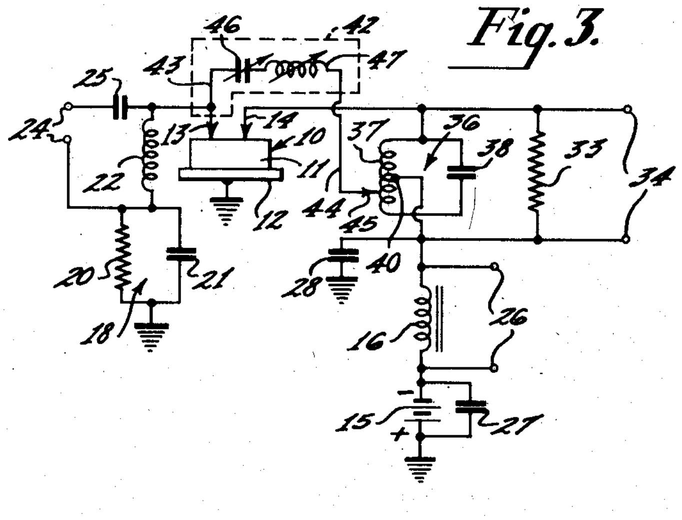
Figure 3 is a circuit diagram of an amplitude modulation system modified in accordance with the invention wherein a compensating network is provided to cancel or compensate for the undesired leakage current.

The undesired phase modulation of the output wave may also be eliminated in accordance with the present invention by means of the circuit of Figure 3 to which reference is now made. The input circuit of the amplitude modulator of Figure 3 may be identical with that of Figure 1, as illustrated. The input terminals 24 schematically indicate the carrier wave source. The modulation signal source schematically indicated by input terminals 26 may also be connected between collector 14 and base 12 in the manner previously explained in connection with Figure 1.

However, in the circuit of Figure 3 a resonant output circuit 36 is connected between collector 14 and inductor 16. Resonant circuit 36 includes inductor 37 and capacitor 38 and is preferably tuned to the frequency of the carrier wave impressed on input terminals 24. The upper terminal of inductor 16 may be connected to an intermediate tap 40 on inductor 37.

The undesired phase modulations are substantially eliminated by means of a compensating network shown within dotted box 42. The compensating network is connected through lead 43 to emitter electrode 13 and through lead 44 to adjustable tap 45 on inductor 37. Figure 3 illustrates a compensating network 42 including capacitor 46 and inductor 47 connected in series, both of which may be adjustable as shown.

By means of the compensating network 42 a predetermined portion of the exciter voltage, that is, of the carrier wave voltage is impressed through tap 45 between collector 14 and base 12. By the transformer action of inductor 37 a portion of the carrier wave applied to tap 45 is impressed on the load resistor 33. By properly adjusting capacitor 46, inductor 42 and the position of tap 45 the amplitude and phase of the wave applied to load resistor 33 may be controlled so that the undesired leakage current may be substantially eliminated or cancelled. The phase of the impressed carrier wave may be adjusted by means of the capacitor 46 and inductor 47. Consequently, the amplitude modulated carrier wave obtained from output terminals 34 will have substantially no phase modulation.

Figure 4:
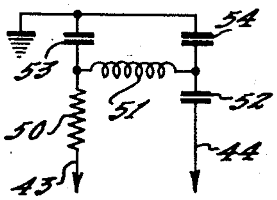
Figures 4 to 6 are circuit diagrams of phase shifting networks which may be used in accordance with the invention in the circuit of Figure 3.

It is feasible to substitute other phase shifting networks for the compensating network 42 of Figure 3. Other suitable phase shifting networks have been illustrated in Figures 4 to 6. Thus Figure 4 shows a pi network including resistor 50, inductor 51 and blocking capacitor 52 connected in series between leads 43 and 44, that is, between emitter 13 and variable tap 45. The two terminals of inductor 51 are bypassed to ground by capacitor 53 and 54 respectively. The voltage and phase of the current injected into variable tap 45 may be adjusted by resistor 50. Inductor 51, of course, may also be adjusted.

Figure 5:
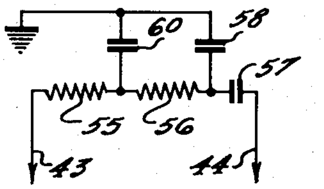

Figure 5 illustrates an RC network which may be substituted, in some cases, for the compensating network 42 in Figure 3. A pair of resistors 55 and 56 and a blocking capacitor 57 are connected in series between leads 43 and 44. The terminals of resistor 56 are bypassed to ground by capacitor 58 and 60 respectively. The phase may be adjusted by adjustment of either resistors 55, 56 or of capacitors 58, 60.

Figure 6:
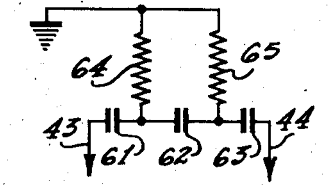

Another RC network which may be substituted for the compensating network 42 is shown in Figure 6. Capacitors 61, 62, and 63 are serially connected between the leads 43, 44. The two junction points of capacitors 61, 62 and 62, 63 are connected to ground through resistor 64 and 65 respectively. The phase of the current may again be adjusted by means of capacitors 61 to 63 or resistors 64, 65. It is, of course, to be understood that still other phase shifting networks may be substituted for the compensating network 42 in Figure 3.

There has thus been disclosed an amplitude modulator including a semi-conductor device such as a transistor. The amplitude modulator comprises circuit means for compensating or substantially eliminating the inherent undesired phase modulation which is produced by the leakage current existing between the emitter and collector electrodes of a transistor. The phase modulation may either be eliminated by providing a high pass filter or a band pass filter in the output circuit which rejects the fundamental of the carrier wave and its modulation side bands. Alternatively, a compensating network may be coupled between emitter and collector electrodes for compensating for the undesired leakage current.

What is claimed is:

1. An amplitude modulator comprising a semi-conductor device including a semi-conducting body, a base electrode, an emitter electrode and a collector electrode in contact with said body, means applying a potential in the reverse direction between said collector and base electrode, means for applying a potential in the forward direction between said emitter and base electrodes of a magnitude to provide for class C operation, a carrier wave source coupled between said emitter and base electrodes, a modulation signal source coupled between said collector and base electrodes, a high pass network coupled between said collector and base electrodes for passing the second harmonic of said carrier wave with its modulation side bands and for rejecting the fundamental of said carrier wave with its modulation side bands, and a load impedance element coupled to said network.

2. A modulator as defined in claim 1 wherein said high pass network consists of a pi network.

3. A modulator as defined in claim 1 wherein said network consists of a pi network providing a band pass filter and including at least one parallel resonant circuit.

4. An amplitude modulation system comprising a semi-conductor device including a semi-conducting body, a base electrode, an emitter electrode and a collector electrode in contact with said body, means for applying operating potentials to said electrodes, a carrier-wave source coupled between said emitter and base electrodes for applying the carrier wave thereto, a source of a modulation signal coupled between said collector and base electrodes for applying the modulation signal thereto, a load impedance element coupled effectively between said collector and base electrodes for deriving therefrom an amplified carrier wave amplitude modulated in accordance with said modulation signal, said semi-conductor device having inherently a leakage current between said emitter and collector electrodes which tends to produce an undesired phase modulation of said amplitude modulated carrier wave, circuit means comprising a network coupled effectively between said collector and base electrodes and for passing a predetermined harmonic of said carrier wave with the modulation side bands of said harmonic and to reject the fundamental of said carrier wave with its modulation side bands.

LESLIE L. KOROS.

References Cited in the file of this patent

UNITED STATES PATENTS

| Number | Name | Date |
|---|---|---|
| 2,298,930 | Decino | Oct. 13, 1942 |
| 2,436,066 | Favre | Feb. 17, 1948 |
| 2,476,323 | Rack | July 19, 1949 |
| 2,486,776 | Barney | Nov. 1, 1949 |